(12) United States Patent
Jun et al.

(10) Patent No.: US 6,878,598 B2
(45) Date of Patent: Apr. 12, 2005

(54) METHOD OF FORMING THICK METAL SILICIDE LAYER ON GATE ELECTRODE

(75) Inventors: Jin-won Jun, Seoul (KR); Kong-soo Cheong, Seoul (KR); Jeong-ho Shin, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/731,761

(22) Filed: Dec. 9, 2003

(65) Prior Publication Data

US 2004/0132274 A1 Jul. 8, 2004

(30) Foreign Application Priority Data

Jan. 8, 2003 (KR) .............................. 10-2003-0001051

(51) Int. Cl.[7] .................. H01L 21/336; H01L 21/3205; H01L 21/4763
(52) U.S. Cl. ........................ 438/303; 438/592; 438/595
(58) Field of Search ................................ 438/303, 592, 438/299, 595, 307, 586, 652, 683

(56) References Cited

U.S. PATENT DOCUMENTS

| 4,877,755 | A | * | 10/1989 | Rodder | 438/586 |
|---|---|---|---|---|---|
| 5,731,239 | A | * | 3/1998 | Wong et al. | 438/296 |
| 5,766,990 | A | * | 6/1998 | El-Diwany | 438/202 |
| 5,766,997 | A | * | 6/1998 | Takeuchi | 438/257 |
| 5,953,612 | A | * | 9/1999 | Lin et al. | 438/299 |
| 6,015,740 | A | * | 1/2000 | Milic-Strkalj | 438/300 |
| 6,066,532 | A | * | 5/2000 | Chen et al. | 438/259 |
| 6,153,485 | A | | 11/2000 | Pey et al. | 438/305 |
| 6,162,691 | A | * | 12/2000 | Huang | 438/300 |
| 6,271,133 | B1 | * | 8/2001 | Lim et al. | 438/683 |
| 6,376,320 | B1 | * | 4/2002 | Yu | 438/303 |
| 6,413,807 | B1 | * | 7/2002 | Mikagi | 438/198 |
| 6,423,634 | B1 | * | 7/2002 | Wieczorek et al. | 438/655 |

* cited by examiner

Primary Examiner—John F. Niebling
Assistant Examiner—Walter L. Lindsay, Jr.
(74) Attorney, Agent, or Firm—Mills & Onello LLP

(57) ABSTRACT

Provided is a method of forming a thick metal silicide layer on a gate electrode. The method includes forming a gate electrode of a transistor on a semiconductor substrate, wherein a hard mask is formed on the gate electrode, forming a spacer on a sidewall of the gate electrode, forming a first silicide layer on a portion of the semiconductor substrate, adjacent to the spacer, forming an insulating layer on the first suicide layer to expose upper portions of the hard mask and the spacer, selectively etching the exposed upper portions of the hard mask and the spacer using the insulating layer as an etch mask until the top surface and the sidewall of the gate electrode are exposed, forming a metal layer on the exposed top surface and sidewall of the gate electrode, and forming a second silicide layer on the gate electrode by siliciding the metal layer.

20 Claims, 4 Drawing Sheets

METHOD OF FORMING THICK METAL SILICIDE LAYER ON GATE ELECTRODE

This application claims the priority of Korean Patent Application No. 2003-01051, filed on Jan. 8, 2003, in the Korean Intellectual Property Office, the contents of which are incorporated herein in their entirety by reference.

BACKGROUND OF THE INVENTION

1. Field of the Invention

The present invention relates to a semiconductor device, and more particularly, to a method of forming a thick metal silicide layer on a gate electrode by expanding a contact region between a metal layer and the gate electrode to reduce resistance of the gate electrode.

2. Description of the Related Art

In recent years, as cells are becoming smaller in size, semiconductor devices are more efficient in performance. However, as the design rule of semiconductor devices has been reduced to 0.1 μm or less, the fabrication process becomes more complicated. For example, it is difficult to isolate devices in a cell, pattern a gate electrode to 0.1 μm or less, perform source/drain engineering, form a reliable contact structure, and pattern a first metal layer (metal-1).

Fabrication of a semiconductor device comprises forming a transistor followed by forming a metal contact structure and a first metal layer (metal-1). Here, a circuit is structured such that the transistor is operated when power is supplied through the metal contact structure to an active region and a gate electrode that are formed on a substrate. However, the active region formed of silicon (Si) and the gate electrode formed of polysilicon (Poly-Si) have very high resistances, making it difficult to supply power to the transistor. To solve such a problem, a silicidation process is required to lower the resistances of silicon and polysilicon.

The silicidation process includes forming a silicide layer on a source/drain region and a gate electrode of a transistor so as to facilitate the power supply to the transistor. An example of the silicidation process is disclosed in U.S. Pat. No. 6,376,320 B1 entitled "Method for Forming Field Effect Transistor with Silicides of Different Thickness and of Different Materials for the Source/Drain and the Gate." By way of the silicidation process, a silicide layer is used to decrease the resistances of a source/drain region formed of silicon and a gate electrode formed of polysilicon.

However, as the design rule of a semiconductor device is reduced to 0.1 μm or less, a typical silicidation process does not lead to reduction of resistance because it is difficult to form a metal silicide layer to a desired thickness. During the silicidation process, the silicide layer is selectively formed only in a contact region between a metal layer deposited for silicidation and silicon (or polysilicon). However, because the size of the contact region also decreases with reduction in the design rule, the silicide layer formed in the contact region cannot be used to decrease the resistance.

More specifically, the silicidation process uses a silicide $MSi_x$ generated by a reaction between silicon atoms and metal atoms. Considering such a silicidation process, sufficient silicon source must be supplied to obtain a sufficient silicide. However, as the design rule is reduced to 0.1 μm or less, it becomes very difficult to supply sufficient silicon source.

For instance, the U.S. Pat. No. 6,376,320 B1 proposes a method of forming a silicide layer on a gate electrode after the top surface of the gate electrode is exposed. In this case, as the design rule is reduced to 0.1 μm or less, the width of the gate electrode is also reduced to 0.1 μm or less. Thus, since a metal layer for a silicide layer is formed only on the top surface of the gate electrode, a contact region between the metal layer and polysilicon is limited to the top surface of the gate electrode. As a result, as the width of the gate electrode is reduced to 0.1 μm or less due to the design rule, the top surface of the gate electrode and the contact region are also greatly narrowed.

A reduction in the contact area between the gate electrode and the metal layer limits the supply of a silicon source from the gate electrode, thereby making it difficult to form a sufficiently thick metal silicide layer on the gate electrode. To alleviate such a problem, the silicidation process may be performed at a higher temperature for a longer duration of time. However, this may adversely affect the reliability of a silicide layer formed on a source/drain region, as in the U.S. Pat. No. 6,376,320 B1.

Further, the amount of silicon source supplied during the silicidation reaction greatly depends on the contact area between the metal layer and silicon. Thus, even if the silicidation process is performed at a higher temperature for a longer duration of time, it is difficult to grow a silicide layer to a sufficient thickness.

Therefore, when the width of a gate electrode is reduced to 0.1 μm or less with reducing design rule, in order to lower the resistance of the gate electrode, a new method of forming a thick silicide layer on the gate electrode formed of polysilicon is required. To form a thick silicide layer on a gate electrode having a line width of 0.1 μm or less, first, a silicon source should be sufficiently supplied during a silicidation process. Also, to supply sufficient silicon source, a contact region between a metal layer formed for silicidation and a gate electrode must be greatly expanded.

SUMMARY OF THE INVENTION

The present invention provides a method of forming a silicide layer on a gate electrode, on which the resistance of the gate electrode is reduced. A contact region between a metal layer formed for a metal silicide and the gate electrode is expanded to supply sufficient silicon source during a silicidation process. Thus, a sufficiently thick silicide layer is formed on the gate electrode, thereby reducing the resistance of the gate electrode.

In accordance with an aspect of the present invention, there is provided a method of forming a thick metal silicide layer on a gate electrode. The method comprises: (i) forming a gate electrode of a transistor on a semiconductor substrate, wherein a hard mask is formed on the gate electrode; (ii) forming a spacer on a sidewall of the gate electrode; (iii) forming a first silicide layer on a portion of the semiconductor substrate, adjacent to the spacer; (iv) forming an insulating layer on the first silicide layer to expose upper portions of the hard mask and the spacer; (v) selectively etching the exposed upper portions of the hard mask and the spacer using the insulating layer as an etch mask until the top surface and the sidewall of the gate electrode are exposed; (vi) forming a metal layer on the exposed top surface and sidewall of the gate electrode; and (vii) forming a second silicide layer on the gate electrode by siliciding the metal layer.

The insulating layer may be formed of a material having an etch selectivity with respect to the hard mask and the spacer. For example, the hard mask and/or the spacer may be formed of silicon nitrides while the insulating layer may be formed of a silicon oxide.

Forming the insulating layer may comprise depositing the insulating layer on the first silicide layer, and planarizing the insulating layer so as to expose the top surface of the hard mask and the upper portion of the spacer. Here, planarizing the insulating layer comprises planarizing the insulating layer using the top surface of the hard mask as an etch stop point, and detecting the etch stop point and performing the planarization, slightly, more excessively to a predetermined degree. Also, planarizing the insulating layer can be performed using chemical mechanical polishing (CMP).

The second silicide layer may be formed of a different material from the first silicide layer. For instance, the first silicide layer may be formed of a cobalt silicide layer while the second silicide layer may be formed of a nickel silicide layer. Also, considering the contact area between the sidewall of the gate electrode and the metal layer, the second silicide layer may be formed to be thicker than the first silicide layer.

In accordance with another aspect of the present invention, there is provided a method of forming a thick metal silicide layer on a gate electrode, which comprises: (i) forming a gate electrode of a transistor on a semiconductor substrate, wherein a hard mask is formed on the gate electrode; (ii) forming a spacer on the sidewall of the gate electrode; (iii) forming a first silicide layer on a portion of the semiconductor substrate, adjacent to the spacer; (iv) forming an etch stop layer on the first silicide layer to be extended so as to cover the hard mask and the spacer; (v) forming an insulating layer on the etch stop layer to selectively expose a portion of the etch stop layer that overlaps upper portions of the hard mask and the spacer; (vi) selectively etching the exposed portion of the etch stop layer and the upper portions of the hard mask and the spacer disposed under the etch stop layer until the top surface and the sidewall of the gate electrode are exposed; (vii) forming a metal layer on the exposed top surface and sidewall of the gate electrode; and (viii) forming a second silicide layer on the gate electrode by siliciding the metal layer.

The insulating layer may be formed of an insulating material having an etch selectivity with respect to the etch stop layer, the hard mask and the spacer. The etch stop layer, the hard mask, and the spacer may be formed of materials having an etch selectivity with respect to the silicon oxide, such as silicon nitrides.

Forming the insulating layer may comprise depositing the insulating layer on the etch stop layer, and planarizing the insulating layer such that a shoulder portion of the etch stop layer is exposed. Here, planarizing the insulating layer may comprise planarizing the insulating layer using the top surface of the etch stop layer as an etch stop point, and detecting the etch stop point and performing the planarization, slightly, more excessively until the lateral shoulder portion of the etch stop layer is exposed.

According to the present invention, when a metal silicide layer is formed on a gate electrode to reduce the resistance of the gate electrode, a contact region between a metal layer required for the metal silicide layer and the exposed surface of the gate electrode can be expanded. A silicon source can be sufficiently supplied during a silicidation process. As a result, a thick suicide layer can be formed on the gate electrode, thereby reducing the resistance of the gate electrode.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

In the present invention, forming a transistor on a semiconductor substrate is followed by separately forming a first silicide layer on a source/drain region adjacent to a gate electrode and forming a second silicide layer on the gate electrode. Forming the second silicide layer on the gate electrode comprises exposing the top surface and the sidewalls of the gate electrode, forming a metal layer, and performing a silicidation process.

In the present invention, the contact area between the metal layer and the gate electrode can be increased by exposing the top surface and the adjacent sidewalls of the gate electrode. Thus, a silicon source can be sufficiently supplied from the gate electrode during the silicidation process. As a result, even if the line width of the gate electrode is sharply reduced to 0.1 $\mu$m or less, the silicide layer can be formed to be thick enough to decrease the resistance of the gate electrode.

Typically, in a silicidation process, the amount of generated silicide depends on the amount of polysilicon supplied from the gate electrode during the silicidation process. Also, the amount of silicon source supplied during the silicidation process depends on the contact area between the gate electrode formed of the polysilicon and the metal layer.

In the present invention, before depositing a metal layer required for the silicidation process, the top surface and the adjacent sidewalls of the gate electrode are exposed. This allows a big increase in the contact area between the gate electrode and the metal layer. As the line width of the gate electrode is reduced to 0.1 $\mu$m or less, with the exposure of only the top surface of the gate electrode, it is impossible to generate a sufficient amount of silicide using the silicidation process.

However, in the present invention, the sidewalls of the gate electrode are partially exposed to increase the contact area between the gate electrode and the metal layer. Thus, silicon atoms can be sufficiently supplied from the gate electrode to the metal layer during the silicidation process. As a result, a sufficient amount of silicide can be generated, and the silicide layer can be formed to be thick enough to reduce the resistance of the gate electrode.

Hereinafter, the embodiment of the present invention will be described in more detail with reference to the appended drawings.

FIGS. 1 through 8 are schematic cross-sectional views illustrating a method of forming a silicide layer on a gate electrode according to an embodiment of the present invention.

Figure 1:
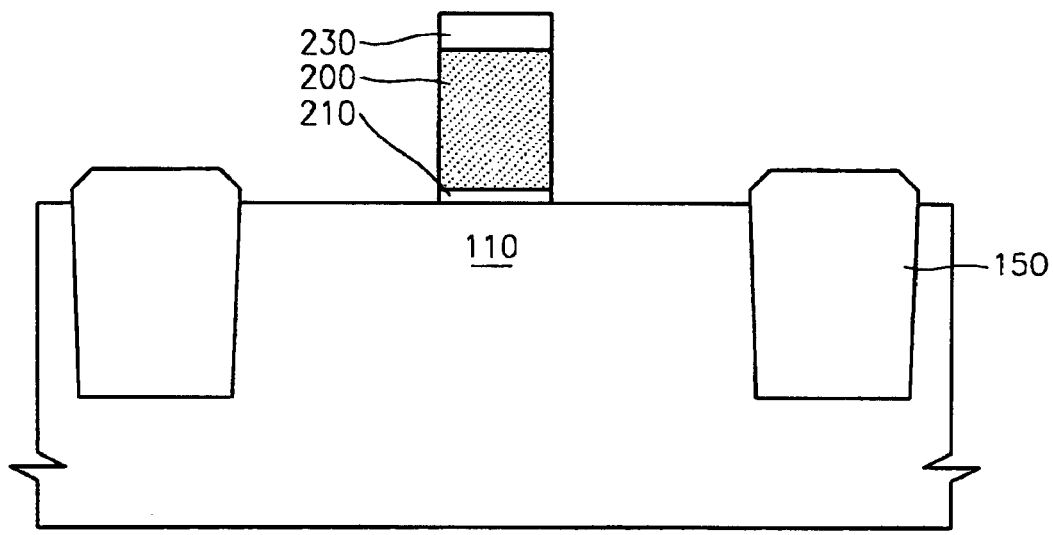
FIGS. 1 through 8 are schematic cross-sectional views illustrating a method of forming a thick metal silicide layer on a gate electrode according to an embodiment of the present invention.

FIG. 1 is a cross-sectional view illustrating a step of forming a gate stack.

Referring to FIG. 1, a device isolation region 150 is formed in a semiconductor substrate 100 to define an active region 110. The semiconductor substrate 100 is preferably a silicon substrate. Next, a gate oxide layer 210 is formed on the active region 110, and a conductive layer (e.g. a conductive polysilicon layer) is then deposited on the gate oxide layer 210. Thus, a gate electrode layer is formed. After this, a hard mask 230 is formed on the gate electrode layer. Afterwards, by using the hard mask 230 as an etch mask, the gate electrode layer is patterned using photolithographic and etching processes. As a result, a gate electrode 200 is formed.

The hard mask 230 is formed of a material having an etch selectivity with respect to polysilicon, for example, $Si_3N_4$. The thickness of the hard mask 230 may vary according to the height of the gate electrode 200. For example, when the height of the gate electrode 200 is about 1500 Å to 2000 Å, the hard mask 230 may be formed to a thickness of about 300 Å to 500 Å. Since the height of the gate electrode 200 can reach about 10000 Å, the thickness of the hard mask 230 is preferably pre-determined depending on the height of the gate electrode 200.

Meanwhile, as the design rule is reduced to 0.1 μm or less, the gate electrode 200 is also formed to have a line width of about 0.1 μm or less.

Figure 2:
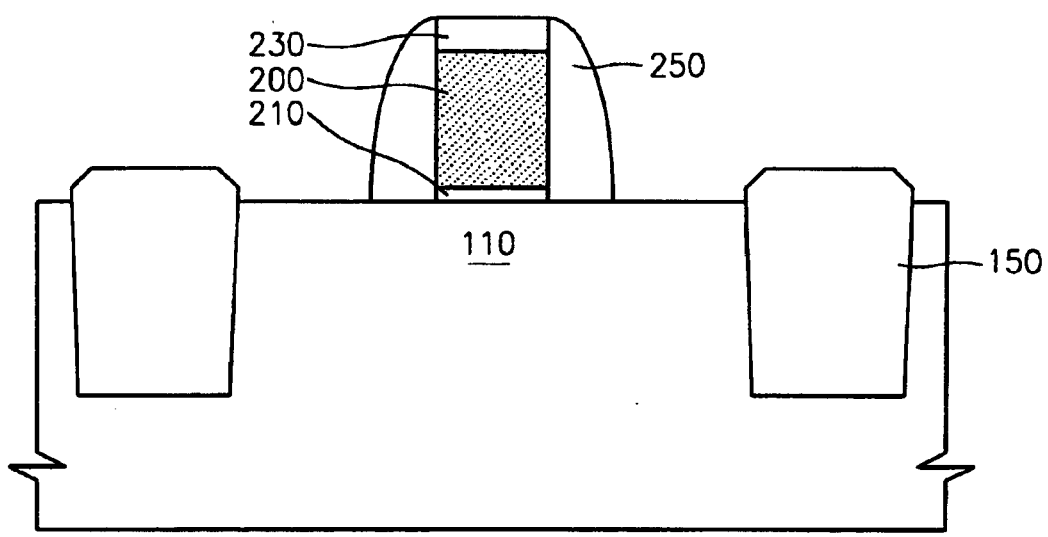

FIG. 2 is a cross-sectional view illustrating a step of forming a spacer 250 on the sidewalls of the gate electrode 200.

Referring to FIG. 2, a spacer 250 is formed on the sidewall of the gate electrode 200 by a known method. The spacer is formed of a material having an etch selectivity with respect to an interlayer dielectric (ILD) formed of, for example, a silicon oxide, to be formed later. The spacer 250 may be formed as a multi-layer or a sandwich of two silicon nitride layers separated by mid temperature oxide (MTO). The spacer 250 may be formed to different thicknesses according to the type of a semiconductor device and the height of the gate electrode 200. Preferably, the spacer 250 is formed by etching a deposited layer having a thickness of about 300 Å to 500 Å.

After forming the spacer 250, a lightly doped drain (LDD)-type source/drain region (not shown) is formed in the active region 110 of the semiconductor substrate 100 adjacent to the gate electrode 200, thereby completing a transistor. The source/drain region is formed using an ion implantation process.

Figure 3:
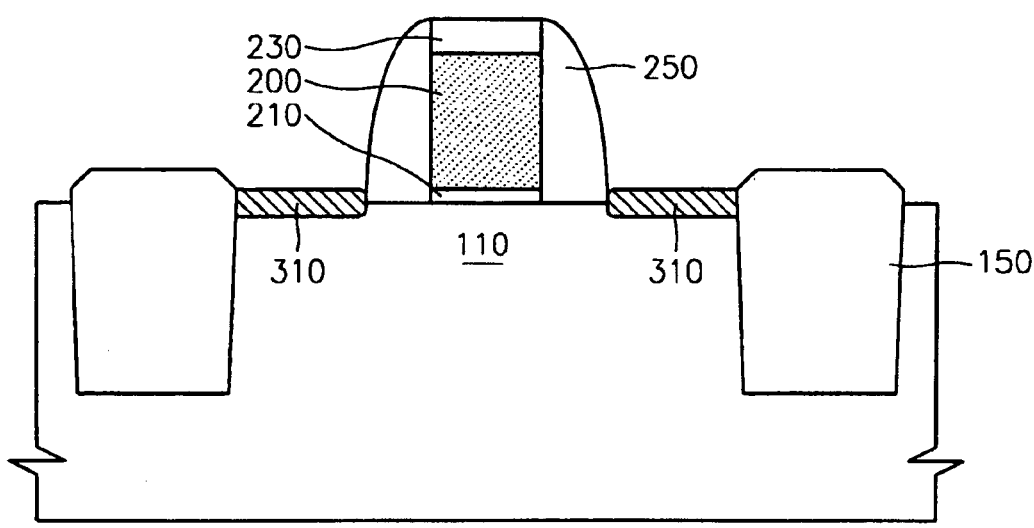

FIG. 3 is a cross-sectional view illustrating formation of a first silicide layer 310 on the active region 110.

Referring to FIG. 3, after forming the gate spacer 250, a first metal layer is deposited on the active region 110 where the source/drain region is formed. Afterwards, a portion of the first metal layer, contacting the active region 110, is silicided using a silicidation process so as to form a first silicide layer 310. Then, a non-silicided portion of the first metal layer, which does not contact the active region 110, is selectively removed to complete the first silicide layer 310.

The first silicide layer 310 can compensate for a relatively high resistance of the source/drain region formed in the active region 110, thereby reducing the entire resistance. This enables stable supply of power to the source/drain under the condition of a lower resistance.

The first silicide layer 310 may be formed of various metal silicides $Msi_x$, such as cobalt silicide $CoSi_x$, nickel silicide $NiSi_x$, and molybdenum silicide $MoSi_x$. Considering an influence on a channel and the speed and reliability of a semiconductor device, the first silicide layer 310 is preferably formed of cobalt silicide.

Figure 4:
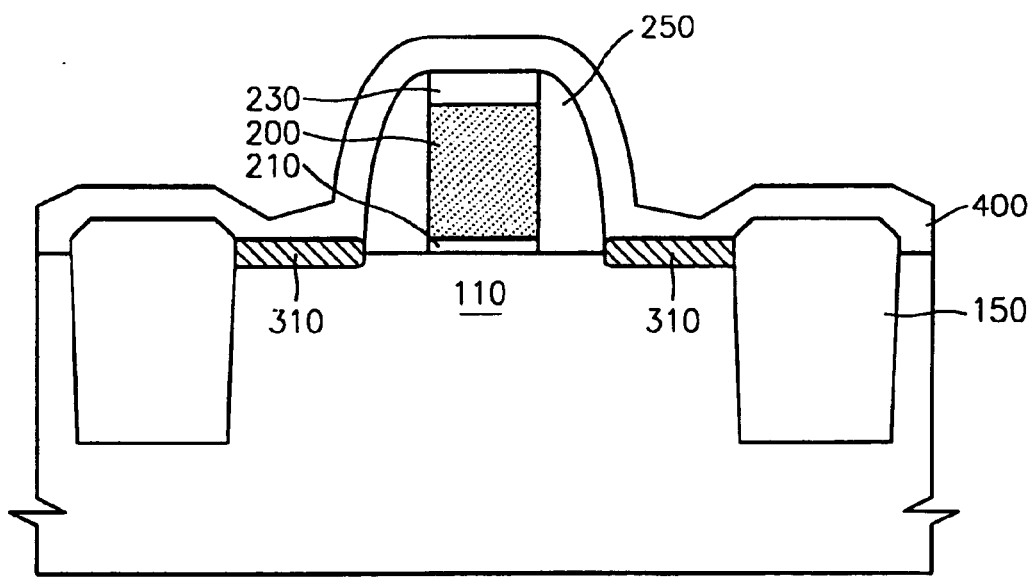

FIG. 4 is a cross-sectional view illustrating a step of forming an etch stop layer 400.

Referring to FIG. 4, the etch stop layer 400 is additionally formed to cover the first silicide layer 310. The etch stop layer 400 may be formed to protect the first silicide layer 310 from etching damage during a subsequent etching process. For example, a contact structure, required for forming a contact, is formed on the first silicide layer 310 during the formation of a first metal layer (metal-1). In a case where the first silicide layer 310 is exposed during an etching process for forming a contact hole, the first silicide layer 310 may be removed by way of a gas atmosphere used in the etching process. To prevent the removal of the first silicide layer 310, the etching process for forming the contact hole is stopped at the etch stop layer 400 covering the first silicide layer 310.

The etch stop layer 400 can be extended to cover the hard mask 230, which encapsulates the top surface of the gate electrode 200. The extended portion of the etch stop layer 400, which will be described in detail later, may be used as an etch stop point during a subsequent planarization process.

The etch stop layer 400 is preferably formed of an insulating material having an etch selectivity with respect to an ILD formed of, for example, a silicon oxide to be formed later. For example, the etch stop layer 400 may be formed of silicon nitride.

Figure 5:
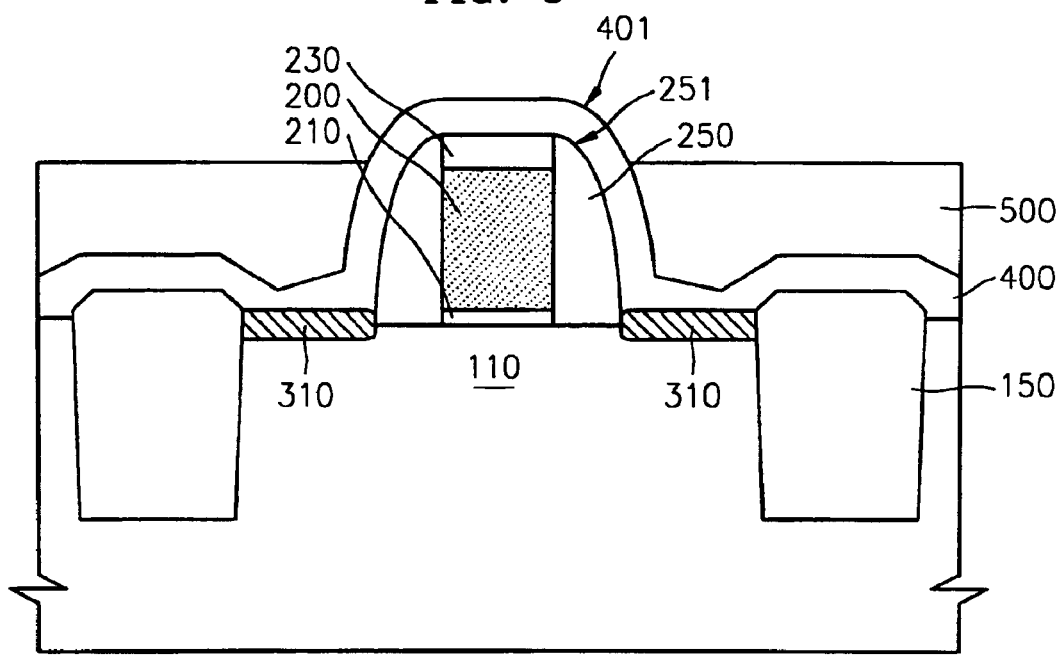

FIG. 5 is a cross-sectional view illustrating formation of an insulating layer 500 so as to expose an upper portion of the gate electrode 200 corresponding to a region where the hard mask 230 and the spacer 250 are positioned.

Referring to FIG. 5, the insulating layer 500 is formed to cover the gate electrode 200 and the first suicide layer 310. The insulating layer 500 is preferably formed of an insulating material having an etch selectivity with respect to the hard mask 230 and the gate spacer 250, which are formed on the gate electrode 250. Further, if the etch stop layer 400 is formed, the insulating layer 500 is also formed of an insulating material having an etch selectivity with respect to the etch stop layer 400.

For example, when the hard mask 230, the gate spacer 250, and the etch stop layer 400 are formed of silicon nitrides, the insulating layer 500 may be formed of a silicon oxide, which has an etch selectivity with respect to the silicon nitride. The insulating layer 500 is preferably formed of a silicon oxide having a good gap fill characteristic so as to fill a gap between the gate electrode 200 and another gate electrode.

After forming the insulating layer 500 on the hard mask 230 of the gate electrode 200 (alternatively, on the etch stop layer 400 if the etch stop layer 400 is formed) to fill the gap between the gate electrodes 200, the insulating layer 500 is patterned to selectively expose the region where the hard mask 230 and the gate spacer 250 are positioned.

The patterning of the insulating layer 500 may be performed by a conventional planarization process. That is, patterning the insulating layer 500 comprises depositing the insulating layer 500 to cover the gate electrode 200, planarizing the insulating layer 500 until the top surface of the gate electrode 200 is exposed.

For example, as shown in FIG. 5, in a case where the etch stop layer 400 is formed, the insulating layer 500 is deposited on the etch stop layer 400 so as to fill the gap between the gate electrodes 200, and then the entire surface of the insulating layer 500 is planarized. Here, the planarization process preferably uses chemical mechanical polishing (CMP). The CMP process is performed using the top surface of the etch stop layer 400 as an etch stop point (or a polishing stop point).

Preferably, the CMP process is performed until the surface of the planarized insulating layer 500 becomes lower than the top surface of the etch stop layer 400. To do so, an over CMP process may be performed. That is, after detecting the etch stop layer 400 as the etch stop point, the CMP process is performed more for a predetermined time. If necessary, the top surface of the insulating layer 500 may be positioned to be lower than the hard mask 230 of the gate electrode 200. In doing so, as the etch stop layer 400 is formed to cover the gate electrode 200, a shoulder portion 401 of the etch stop layer 400 can be exposed from at least the insulating layer 500.

If the shoulder portion 401 of the etch stop layer 400 is exposed, a portion of the top surface of the spacer 250 covering the sidewall of the gate electrode 200 can be easily removed during a subsequent process. In the present invention, the sidewall of the gate electrode 200 is partially exposed by selectively removing an upper portion from a shoulder portion 251 of the gate spacer 250. Here, the insulating layer 500 is preferably planarized so as to expose a region where the gate spacer 250 is positioned.

Meanwhile, as described above, the etch stop layer 400 is formed to protect the first silicide layer 310 from etching damage during the subsequent process of forming a contact hole. In addition, the etch stop layer 400 enables a region exposed by the insulating layer 500 to be expanded to the gate spacer 250. As shown in FIG. 5, when the insulating layer 500 exposes the shoulder portion 401 of the etch stop layer 400, since the shoulder portion 401 of the etch stop layer 400 overlaps the gate spacer 250, the insulating layer 500 also exposes the gate spacer 250.

Because there is a slight step difference between the top surface of the gate electrode 200 and the shoulder portion 401 of the etch stop layer 400, it is possible to expose the shoulder portion 401 of the etch stop layer 400 without performing an over CMP. Accordingly, the over-polished amount can be reduced, thus shortening a process time required for the CMP process.

Meanwhile, in a case where the etch stop layer 400 is not used optically, the insulating layer 500 is deposited directly on the gate spacer 250 and the hard mask 230. Thus, the insulating layer 500 is planarized to expose the shoulder portion 251 of the gate spacer 250 and the top surface of the hard mask 230. Preferably, the shoulder portion 251 of the gate spacer 250 is exposed such that the sidewall of the gate spacer 250 is exposed.

The planarization process comprises performing a CMP process by using the top surface of the hard mask 230 and the shoulder portion 251 of the gate spacer 250 as a polishing stop point. Here, to tightly expose the shoulder portion 251 of the gate spacer 250, an over CMP process is performed more for a predetermined time after detecting the polishing stop point.

In the present invention, the insulating layer 500 is planarized to expose the upper portion of the gate spacer 250, or to expose the gate spacer 250 as shown in FIG. 5. Thus, the upper portion of the gate spacer 250 can be selectively removed in a subsequent process to expose the sidewall of the gate electrode 200.

Figure 6:
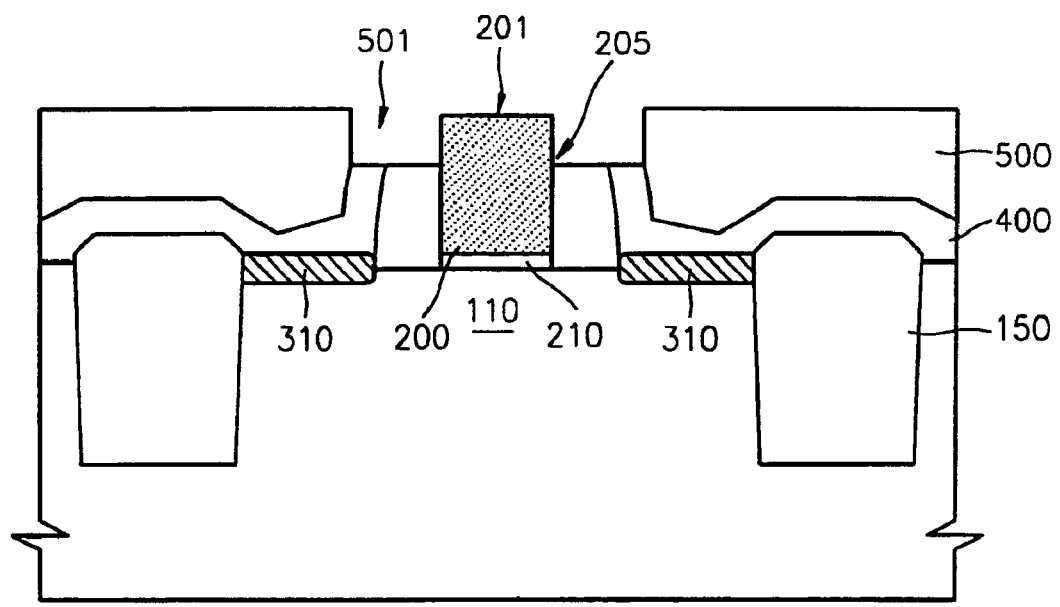

FIG. 6 is a cross-sectional view illustrating a step of selectively removing the upper portions of the hard mask 230 and the spacer 250.

Referring to FIG. 6, by using the patterned insulating layer 500 as an etch mask, the exposed etch stop layer 400 and the upper portions of the hard mask 230 and the gate spacer 250 are selectively removed. Here, the hard mask 230 is selectively and completely etched so as to expose the top surface 201 of the gate electrode 200. Also, the upper portion of the gate spacer 250 is selectively etched such that the upper sidewall 205 of the gate electrode 200 is partially exposed.

The etch stop layer 400, the hard mask 230, and the gate spacer 250, which are formed of silicon nitrides, are etched using an etching method having an etch selectivity with respect to the insulating layer 500 formed of a silicon oxide, used as the etch mask.

For example, the selective etching may be performed using a phosphoric acid wet etch process. Alternatively, a dry etching process may be performed using an etch gas including a gas of the carbon-fluorine ($CF_x$) group and an oxygen gas.

The selective etching allows not only the top surface 201 of the gate electrode 200 but also the upper sidewall 205 of the gate electrode 200 to be exposed. If necessary, the exposed area of the upper sidewall 205 of the gate electrode 200 can be increased up to, for example, ½ the height of the gate electrode. That is, the height of the gate spacer 250 can be decreased to about 50 Å to 10000 Å. However, the gate spacer 250 preferably remains to cover part of the height of the lower sidewall of the gate electrode 200. As a result, the remaining gate electrode 200 can prevent penetration of metal atoms from a second silicide layer into the substrate 100 during a subsequent process.

Because the exposed area of the upper sidewall 205 of the gate electrode 200 determines the thickness of the second suicide layer to be formed later, if it is expected that the second silicide layer is formed to a thick thickness, the exposed area of the upper sidewall 205 of the gate electrode 250 should be increased. That is, the selective etching should be performed for a longer amount of time in order to increase the etched amount of the gate spacer 250.

As shown in FIG. 6, by way of the selective etching, a groove 501 is formed to expose the upper sidewall 205 of the gate electrode 200.

Figure 7:
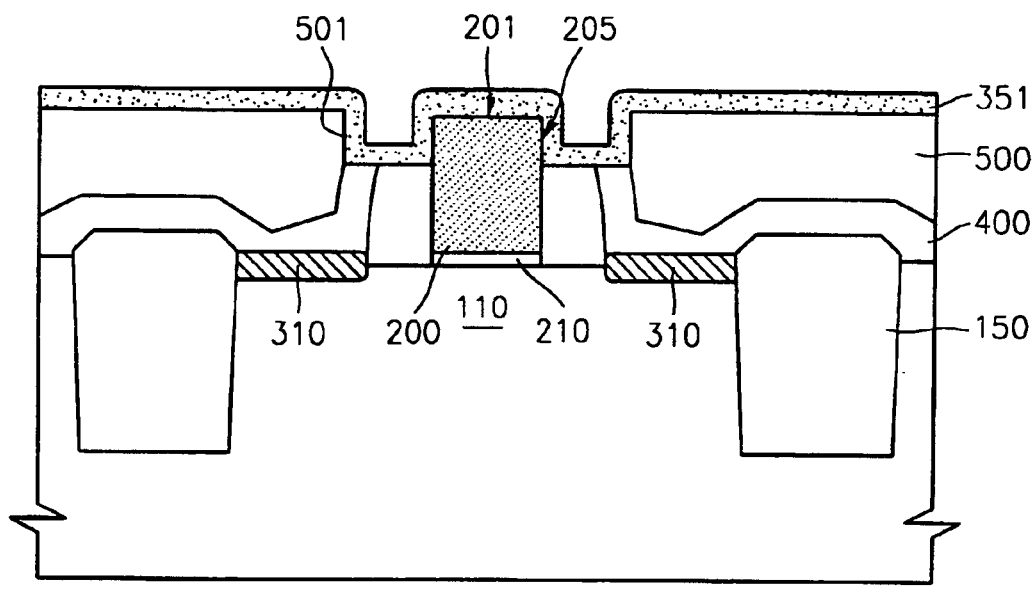

FIG. 7 is a cross-sectional view illustrating a step of forming a second metal layer 351 on the exposed surface of the gate electrode 200.

Referring to FIG. 7, the second metal layer 351 is formed on the insulating layer 500 so as to contact the top surface 201 and the upper sidewall of the gate electrode. During a subsequent second silicidation process, a reaction between the second metal layer 351 and silicon atoms of the gate electrode 200 occurs, generating metal silicide on the gate electrode 200. Thus, the second metal layer 351 may be formed of, for example, cobalt, nickel, or molybdenum. Preferably, to reduce the resistance of the gate electrode 200, the second metal layer 351 is formed of nickel.

Figure 8:
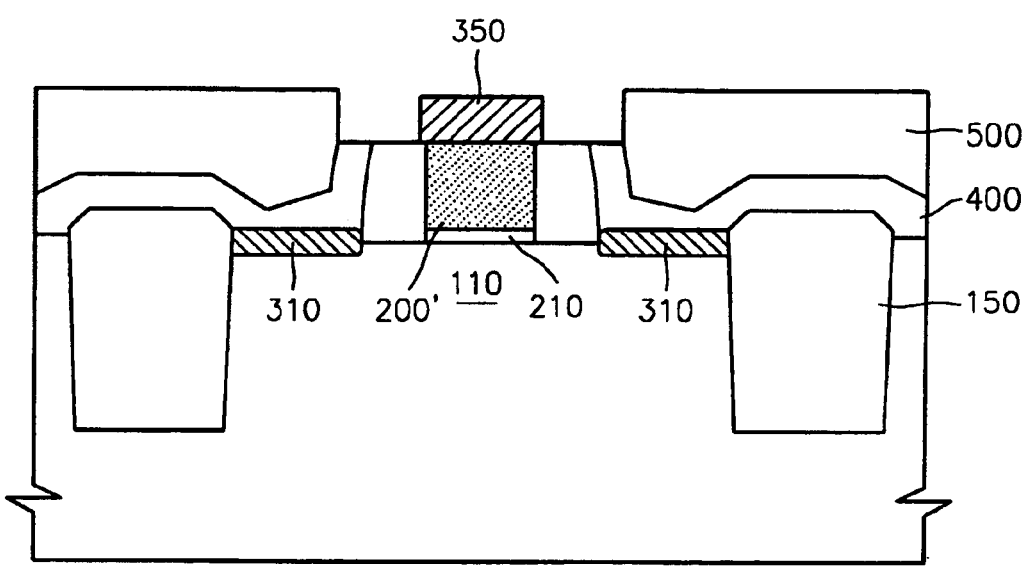

FIG. 8 is a cross-sectional view illustrating a step of forming a second silicide layer 350.

Referring to FIG. 8, a portion of the second metal layer (351 of FIG. 7), which contacts the gate electrode 200, is silicided using the second silicidation process. Next, the non-silicided portion of the second metal layer 351 is selectively removed or stripped. Thus, the second silicide layer 350 is formed on the gate electrode 200. The second silicide layer 350 may be formed of various metal silicides $MSi_x$, such as as cobalt silicide $CoSi_x$, nickel silicide $NiSi_x$, and molybdenum silicide $MoSi_x$. Preferably, to reduce the resistance of the gate electrode 200, the second silicide layer 350 is formed of a nickel silicide.

Meanwhile, in the present invention, the contact area between the second metal layer (351 of FIG. 7) and the gate electrode 200 can be increased during the second silicidation process. That is, the second metal layer 351 contacts not only the top surface (201 of FIG. 7) of the gate electrode 200 but also the upper sidewall (205 of FIG. 7) of the gate electrode 200. Since the contact area between the gate electrode 200 and the second metal layer 351 can be greatly expanded, silicon atoms can be sufficiently supplied to the second metal layer 351 during the second silicidation process. Thus, the second silicide layer 350 can be formed to a required thickness.

As the design rule of a semiconductor device is reduced to 0.1 μm or less, the line width of the gate electrode is also reduced to 0.1 μm or less. Accordingly, if the contact area between the gate electrode 200 and the second metal layer 351 is not expanded, i.e., if the second metal layer contacts only the top surface of the gate electrode as in the conventional method, the silicon atoms cannot be sufficiently supplied to the second metal layer during the second silicidation process.

The silicidation reaction requires supply of the sufficient silicon atoms for generating a sufficient silicide layer. However, in the conventional method, even if the line width of the gate electrode is reduced to 0.1 μm or less, because the second metal layer contacts only the top surface of the gate electrode, the silicon atoms cannot be sufficiently supplied. As a result, the second silicide layer is formed to a very thin thickness so as not to reduce the resistance of the gate electrode.

On the other hand, in the present invention, as shown in FIG. 7, the second metal layer 351 can contact not only the top surface 201 of the gate electrode 200 but also the upper sidewall 205 of the gate electrode 200. Thus, as the contact area is greatly expanded, a silicon source is sufficiently supplied to the second metal layer 351 during the second silicidation process. As a result, a sufficient amount of silicide is generated, thus forming the second silicide layer 350 to a thick thickness.

Further, when the upper portion of the gate spacer 250 is selectively etched, the exposed area of the upper sidewall of the gate electrode 200 can be expanded by increasing the etched amount. Thus, the second silicide layer 350 can be formed to an even thicker thickness. In this case, the resistance of the gate electrode 200 can be reduced during power supply. Consequently, the speed and reliability of the semiconductor device can be highly improved.

Although not shown in the drawing, after forming the second silicide layer 350, an ILD may be formed to cover and insulate the second silicide layer 350. Then, to construct a circuit, a contact hole can be formed, penetrating the ILD, so as to expose the first silicide layer 310. Here, the etch stop layer 310 can protect the first silicide layer 310 from damage caused by an etch gas during an etching process for forming the contact hole.

While the present invention has been particularly shown and described with reference to preferred embodiments thereof, it will be understood by those of ordinary skill in the art that various changes in form and details may be made therein. For example, in the embodiment of the present invention, the process of removing the hard mask and the process of recessing the upper portion of the gate spacer are performed using the same etching process. However, it is possible to remove the hard mask using a separate etching process.

For example, as shown in FIG. 3, after forming the first silicide layer 310, the hard mask 230 may be removed. The selective etching of the hard mask can be performed using a phosphorus acid wet etch process. In this case, the planarization of the insulating layer (500 of FIG. 5) can be performed using the etch stop layer (400 of FIG. 4) as a polishing stop point. Thus, the exposed area of the upper sidewall 205 of the gate electrode 200 can be increased.

As described thus far, according to the present invention, even though the design rule of a semiconductor device is reduced to 0.1 μm or less and the line width of a gate electrode is also reduced to 0.1 μm or less, a metal silicide layer can be formed on the gate electrode to a sufficient thick thickness. Also, because a metal layer, which is required for a silicidation process, contacts not only the top surface of the gate electrode but also the upper sidewall of the gate electrode, a silicon source can be sufficiently supplied to the metal layer during the silicidation reaction. Thus, even if the line width of the gate electrode is reduced, the silicide layer can be formed on the gate electrode to a thick thickness. As a result, the resistance of the gate electrode can be reduced to enable efficient power supply.

Also, since a second silicide layer can be formed of a different material from a first silicide layer formed on a source/drain region, the resistance of the gate electrode can be stably controlled during power supply.

Further, the first silicide layer can be protected from etching damages while the second silicide layer is formed. Thus, the resistance of the gate electrode can be stably controlled during power supply.

While the present invention has been particularly shown and described with reference to preferred embodiments thereof, it will be understood by those of ordinary skill in the art that various changes in form and details may be made therein without departing from the spirit and scope of the present invention as defined by the following claims.

What is claimed is:

1. A method of forming a thick metal silicide layer on a gate electrode, the method comprising:

forming a gate electrode of a transistor on a semiconductor substrate, wherein a hard mask is formed on the gate electrode;

forming a spacer on a sidewall of the gate electrode;

forming a first silicide layer on a portion of the semiconductor substrate, adjacent to the spacer;

forming an insulating layer on the first silicide layer to expose upper portions of the hard mask and the spacer;

selectively etching the exposed upper portions of the hard mask and the spacer using the insulating layer as an etch mask until the top surface and the sidewall of the gate electrode are exposed;

forming a metal layer on the exposed top surface and sidewall of the gate electrode; and forming a second silicide layer on the gate electrode by siliciding the metal layer.

2. The method of claim 1, wherein the insulating layer is formed of a material having an etch selectivity with respect to the hard mask and the spacer.

3. The method of claim 2, wherein the hard mask is formed of a silicon nitride.

4. The method of claim 2, wherein the spacer is formed of a silicon nitride.

5. The method of claim 2, wherein the insulating layer is formed of a silicon oxide.

6. The method of claim 1, wherein forming the insulating layer comprises:

depositing the insulating layer on the first silicide layer; and planarizing the insulating layer so as to expose the top surface of the hard mask and the upper portion of the spacer.

7. The method of claim 6, wherein planarizing the insulating layer comprises:

planarizing the insulating layer using the top surface of the hard mask as an etch stop point; and detecting the etch stop point and further performing the planarization.

8. The method of claim 6, wherein planarizing the insulating layer is performed using chemical mechanical polishing.

9. The method of claim 1, wherein the second silicide layer is formed of a different material from the first silicide layer.

10. The method of claim 9, wherein the first silicide layer is formed of a cobalt silicide layer, and the second silicide layer is formed of a nickel silicide layer.

11. The method of claim 1, wherein the second silicide layer is formed to be thicker than the first silicide layer according to the width of a contact region between the sidewall of the gate electrode and the metal layer.

12. A method of forming a thick metal silicide layer on a gate electrode, the method comprising:

forming a gate electrode of a transistor on a semiconductor substrate, wherein a hard mask is formed on the gate electrode;

forming a spacer on the sidewall of the gate electrode;

forming a first silicide layer on a portion of the semiconductor substrate, adjacent to the spacer;

forming an etch stop layer on the first silicide layer to be extended so as to cover the hard mask and the spacer;

forming an insulating layer on the etch stop layer to selectively expose a portion of the etch stop layer that overlaps upper portions of the hard mask and the spacer;

selectively etching the exposed portion of the etch stop layer and the upper portions of the hard mask and the spacer disposed under the etch stop layer until the top surface and the sidewall of the gate electrode are exposed;

forming a metal layer on the exposed top surface and sidewall of the gate electrode; and forming a second silicide layer on the gate electrode by siliciding the metal layer.

13. The method of claim 12, wherein the insulating layer is formed of an insulating material having an etch selectivity with respect to the etch stop layer, the hard mask, and the spacer.

14. The method of claim 13, wherein the etch stop layer, the hard mask, and the spacer are formed of silicon nitrides.

15. The method of claim 13, wherein the insulating layer is formed of a silicon oxide.

16. The method of claim 12, wherein forming the insulating layer comprises:

depositing the insulating layer on the etch stop layer; and planarizing the insulating layer such that a shoulder portion of the etch stop layer is exposed.

17. The method of claim 16, wherein planarizing the insulating layer comprises:

planarizing the insulating layer using the top surface of the etch stop layer as an etch stop point; and detecting the etch stop point and further performing the planarization until the lateral shoulder portion of the etch stop layer is exposed.

18. The method of claim 12, wherein the second silicide layer is formed of a different material from the first silicide layer.

19. The method of claim 18, wherein the first silicide layer is formed of a cobalt silicide layer, and the second suicide layer is formed of a nickel silicide layer.

20. The method of claim 12, wherein the second silicide layer is formed to be thicker than the first silicide layer according to the width of a contact region between the sidewall of the gate electrode and the metal layer.

* * * * *

UNITED STATES PATENT AND TRADEMARK OFFICE
CERTIFICATE OF CORRECTION

PATENT NO. : 6,878,598 B2
DATED : April 12, 2005
INVENTOR(S) : Jin-won Jun et al.

It is certified that error appears in the above-identified patent and that said Letters Patent is hereby corrected as shown below:

<u>Column 12,</u>
Line 32, please delete "suicide" and insert -- silicide --.

Signed and Sealed this

Nineteenth Day of July, 2005

JON W. DUDAS
*Director of the United States Patent and Trademark Office*